Figure 1:
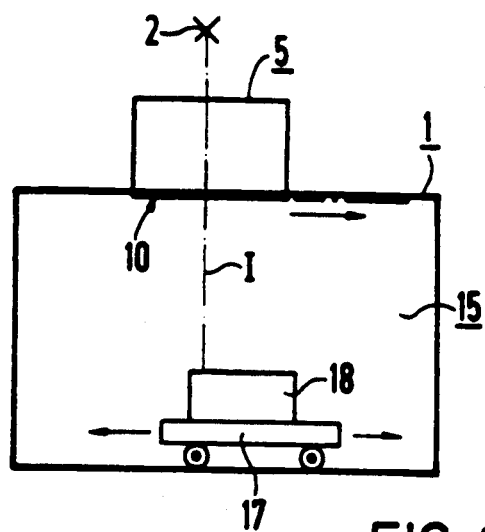

United States Patent [19]

Lamatsch et al.

[11] Patent Number: 5,010,229

[45] Date of Patent: Apr. 23, 1991

[54] APPARATUS FOR ELECTRON BEAM WELDING OF WORKPIECES

[75] Inventors: Hans Lamatsch, Heroldsberg; Dieter Vanek, Nüremberg, both of Fed. Rep. of Germany

[73] Assignee: Siemens Aktiengesellschaft, Berlin & Munich, Fed. Rep. of Germany

[21] Appl. No.: 477,958

[22] PCT Filed: Nov. 25, 1988

[86] PCT No.: PCT/DE88/00732

§ 371 Date: May 24, 1990

§ 102(e) Date: May 24, 1990

[87] PCT Pub. No.: WO89/05206

PCT Pub. Date: Jun. 15, 1989

[30] Foreign Application Priority Data

Nov. 30, 1987 [DE] Fed. Rep. of Germany ....... 3740552

[51] Int. Cl.$^5$ .............................................. B23K 15/00
[52] U.S. Cl. ........................... 219/121.21; 219/121.22; 219/121.13
[58] Field of Search ...................... 219/121.12, 121.13, 219/121.14, 121.21, 121.22, 121.23, 121.31, 121.32

[56] References Cited

U.S. PATENT DOCUMENTS

| 3,020,389 | 2/1962 | Gorman | 219/121.21 X |
| 3,626,142 | 12/1971 | King | 219/121.21 |
| 4,072,844 | 2/1978 | Sayeqh | 219/121.21 |
| 4,398,079 | 8/1983 | Dard et al. | 219/121.21 X |

FOREIGN PATENT DOCUMENTS

| 1954715 | 5/1970 | Fed. Rep. of Germany . |
| 3019728 | 12/1980 | Fed. Rep. of Germany . |
| 1404827 | 5/1965 | France . |
| 1240399 | 9/1971 | United Kingdom . |
| 2056758 | 3/1981 | United Kingdom . |

Primary Examiner—C. L. Albritton
Attorney, Agent, or Firm—Kenyon & Kenyon

[57] ABSTRACT

Installations of this type generally comprise an electron-beam generator connected to a chamber for receiving the workpieces to be welded in which a vacuum can be created by a vacuum pump. According to the invention, the vacuum chamber comprises a first workpiece chamber (5) of small volume and a second workpiece chamber (15) of substantially greater volume. The two chambers are connected by a slide valve (10) in region of the path of the beam (I) generated by the electron-beam generator (2). The ratio of the volume of the two workpiece chambers (5, 15) lies preferably between 5 and 1000, for example at approximately 100.

5 Claims, 1 Drawing Sheet

APPARATUS FOR ELECTRON BEAM WELDING OF WORKPIECES

The invention relates to an apparatus for welding workpieces with an electron beam comprising an electron beam generator and a chamber which is attached thereto for containing the workpieces to be welded. This chamber is able to be evacuated via a vacuum pump.

With such an apparatus, the workpieces must be processed in a vacuum chamber during the electron beam welding process. The size of the workpieces to be welded therefore determines the size of the requisite vacuum chamber. Depending upon the size of the workpieces—and thus of the chamber—substantially long evacuation times for the chamber can ensue.

In practice, it is frequently stipulated that on the one hand, an average quantity of larger workpieces are supposed to be processed in one apparatus, and, on the other hand, very large quantities of smaller pieces are supposed to be processed as well. It is therefore disadvantageous that, in the latter case, the long evacuation times for the large vacuum chambers, which are required for the larger workpieces, must be reckoned with. In practice, this has a cost-increasing effect and is naturally perceived as annoying.

It is therefore the object of the invention to provide an apparatus for electron beam welding wherein both average quantities of larger workpieces as well as large quantities of small parts can be processed in an economical manner.

This object is solved according to the invention in that the vacuum chamber comprises a first workpiece chamber with a small volume and a second workpiece chamber with a considerably larger volume, wherein both are connected via a slide valve in the region of the beaming direction of the electron beam generator. The ratio of the volumes of both workpiece chambers advantageously ranges between 5 and 1000, e.g. approximately 100.

According to the invention, a dual chamber apparatus is provided wherein a mini chamber is located directly below the electron beam generator. This mini chamber can be just large enough so that a very large quantity of small parts can be processed while using a large-dimensioned pump configuration with very short processing times. The mini chamber has a large slide valve directly in the chamber floor at a 90° angle to the axis of the beaming direction of the electron beam generator, which slide valve, when open, clears the access to a large vacuum chamber beneath the mini chamber. In this manner, the slide valve can be opened in case larger workpieces are going to be welded in the apparatus so that the large chamber can be evacuated through the mini chamber and the slide valve. The pumping times, which are prolonged only slightly for the average quantities of the larger workpieces, are able to be accomplished in an economical manner. The electron beam passes from the electron beam generator through the mini chamber and the slide valve into the large chamber in order to process the workpieces in the large chamber.

The elongation of the beam path for the larger workpieces is insignificant in the apparatus according to the invention because it is generally possible to give the mini chamber a flat design due to the shape of the small parts. Overall, an improved economic efficiency results in the process because of the new chamber configuration.

Additional advantages and details of the invention arise from the following description of the figures of an exemplified embodiment in light of the drawing in conjunction with the patent claims.

It is shown in

Figure 2:
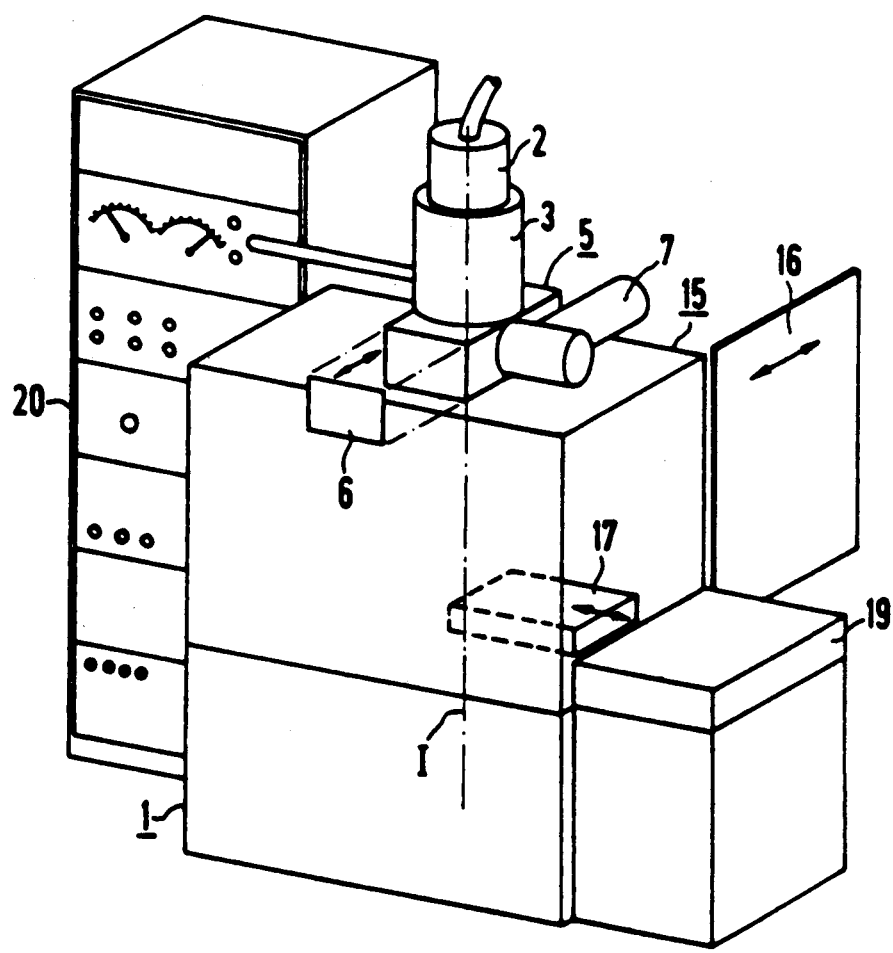

FIG. 1 a schematic representation of an apparatus for electron beam welding from which the principle of the invention is made clear; and FIG. 2 a perspective drawing of an accordingly implemented apparatus to clarify specific further developments of the invention.

The figures are largely described together. In the figures, a vacuum apparatus for welding workpieces with electron beams is designated as 1. In the known manner, this apparatus has an electron beam generator 2 comprising an electron gun with an incandescent cathode from which an electron beam travels in the usual manner along the beaming direction I into the appropriate vacuum chamber.

The vacuum chamber comprises a first small workpiece chamber 5, which, in a flat construction, is mounted directly behind the tube of the electron beam generator 2. A large workpiece chamber 15 lies below this small chamber. Both workpiece chambers 5 and 15 are connected by a large-dimensioned slide valve 10, which largely covers the entire floor area of the small workpiece chamber 5. In this manner, the first workpiece chamber 5 can serve in the closed position of the valve 10 as a mini chamber for small workpiece parts. In the open position of the valve 10, the mini chamber 5 can be directly integrated into the large workpiece chamber 15. In any case, the electron beam can be guided unhindered along the beam axis I. Vacuum pump 7 is coupled to small workpiece chamber 5 only.

The ratio of the volumes of both workpiece chambers can be preselected according to need. In the present example, the volume of the large workpiece chamber 15 is approximately 100 times greater than that of the small workpiece chamber 5. Meaningful values for the ratio of the volumes range approximately between 5 and 1000.

In the apparatus shown in FIG. 2, it has proved particularly suitable to make both workpiece chambers accessible from different sides. Thus, the small workpiece chamber 5 has a door 6 in the front surface, while the large chamber 15 has a door 16 in its lateral surface. It is found to be practical that the door 6 opens to the front, while the door 16 is slid laterally as a sliding door. In this manner, an access to the large workpiece chamber 15 is especially guaranteed in which large, voluminous workpieces are capable of being processed. For this purpose, a tool cart 17 or sled is present which can be loaded on a platform 19 outside the workpiece chamber 15 and then be completely inserted into the chamber 15.

The entire welding apparatus rests on a base platform 18. A control cabinet 20 is provided to contain control and regulating units. If necessary, a visual monitoring device can be provided whereby the individual welding processes within the workpiece chambers 5 or 15 can be followed visually via a TV camera.

I claim:

1. An apparatus for welding workpieces with electrons comprising:
   an electron beam generator having a beaming direction axis;

a first workpiece chamber having a small volume and a second workpiece chamber having a large volume connected to one another via a slide valve located in the beaming direction axis region;

a vacuum pump for evacuating said first and second chambers, said vacuum pump being coupled only to said first chamber having said small volume;

said first chamber having said small volume being adjacent to said electron beam generator and said second chamber having said large volume following adjacent to said first chamber;

each of said first and second chambers having separate access doors, whereby each chamber can be loaded with workpieces independent of one another;

said first chamber with said smaller volume serving for fast welding of relatively small workpieces, and said second chamber with said large volume serving for welding of relatively large workpieces.

2. The apparatus according to claim 1 wherein the ratio of the volume of both workpiece chambers range between 5 and 1000.

3. The apparatus according to claim 2 wherein the ratio is approximately 100.

4. The apparatus according to claim 1 wherein said access doors are mounted on different sides of respective chambers.

5. The apparatus according to claim 1 wherein said first and second chambers are superimposed, said first chamber has a floor area and said slide valve is located in said floor area of said first chamber.

* * * * *